United States Patent
Sayers et al.

(10) Patent No.: US 7,564,070 B2
(45) Date of Patent: Jul. 21, 2009

(54) LIGHT EMITTING DIODE DEVICE HAVING A SHIELD AND/OR FILTER

(75) Inventors: Edwin Mitchell Sayers, Saline, MI (US); James David Tarne, West Bloomfield, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 384 days.

(21) Appl. No.: 11/286,886

(22) Filed: Nov. 23, 2005

(65) Prior Publication Data

US 2007/0114559 A1    May 24, 2007

(51) Int. Cl.
*H01L 33/00* (2006.01)
(52) U.S. Cl. .............................. 257/98; 257/99; 257/100
(58) Field of Classification Search .................. 257/59, 257/72, 79, 81, 88, 98, 99, 100
See application file for complete search history.

(56) References Cited

U.S. PATENT DOCUMENTS

| | | | |
|---|---|---|---|
| 2,215,900 A | 9/1940 | Bitner | |
| 2,224,178 A | 12/1940 | Bitner | |
| 2,254,961 A | 9/1941 | Harris | |
| 2,254,962 A | 9/1941 | Harris et al. | |
| 2,387,816 A | 10/1945 | Wagner | |
| 3,593,014 A | 7/1971 | Vesely | |
| 3,700,883 A | 10/1972 | Donohue et al. | |
| 4,344,110 A | 8/1982 | Ruediger | |
| 4,389,698 A | 6/1983 | Cibie | |
| 4,577,260 A | 3/1986 | Tysoe | |
| 4,613,927 A | 9/1986 | Brandt | |
| 4,642,740 A | 2/1987 | True | |
| 4,704,661 A | 11/1987 | Kosmatka | |
| 4,753,520 A | 6/1988 | Silverglate | |
| 4,770,514 A | 9/1988 | Silverglate | |
| 4,826,273 A | 5/1989 | Tinder et al. | |
| 4,927,248 A | 5/1990 | Sakakibara et al. | |
| 4,958,263 A | 9/1990 | Davenport et al. | |
| 4,972,302 A | 11/1990 | Masuyama et al. | |

(Continued)

FOREIGN PATENT DOCUMENTS

| | | |
|---|---|---|
| DE | 3317519 A1 | 11/1948 |
| EP | 1 601 030 A2 | 11/2005 |
| JP | 05205511 | 8/1993 |
| JP | 06260006 | 9/1994 |
| JP | 02001257381 | 9/2001 |
| WO | WO 89/08223 | 8/1989 |

OTHER PUBLICATIONS

Product Brochure—THE LED LIGHT.com; Luxeon LEDs, Assemblies, and Accessories; pp. 1-4, Jul. 27, 2005.

(Continued)

*Primary Examiner*—Thien F Tran
(74) *Attorney, Agent, or Firm*—Brinks Hofer Gilson & Lione

(57) ABSTRACT

A light emitting diode device capable of shielding or filtering the light in a manner to provide high-gradient edges or regions within the beam pattern. The LED device is also capable of providing selective coloring, thereby cost effectively improving the adaptability and number of applications which can utilize the LED device. The LED device includes an optical layer is positioned in front of a LED chip that includes a material having light transmission properties which change in response to electricity being supplied to the optical layer. The optical layer can thus transmit or absorb light from the LED chip, thus shielding or filtering light from the LED chip.

18 Claims, 2 Drawing Sheets

U.S. PATENT DOCUMENTS

| | | | |
|---|---|---|---|
| 5,042,928 A | 8/1991 | Richards |
| 5,081,564 A | 1/1992 | Mizeguchi et al. |
| 5,161,059 A | 11/1992 | Swanson et al. |
| 5,184,883 A | 2/1993 | Finch et al. |
| 5,192,985 A | 3/1993 | Abe |
| 5,276,594 A | 1/1994 | Burkett et al. |
| 5,311,410 A | 5/1994 | Hsu et al. |
| 5,343,330 A | 8/1994 | Hoffman et al. |
| 5,369,554 A | 11/1994 | Erion |
| 5,434,756 A | 7/1995 | Hsu et al. |
| 5,440,456 A | 8/1995 | Bertling et al. |
| 5,485,317 A | 1/1996 | Perissinotto et al. |
| 5,526,190 A | 6/1996 | Hubble, III et al. |
| 5,532,909 A | 7/1996 | Ban et al. |
| 5,567,031 A | 10/1996 | Davenport et al. |
| 5,577,492 A | 11/1996 | Parkyn, Jr. et al. |
| 5,608,290 A | 3/1997 | Hutchisson et al. |
| 5,757,557 A | 5/1998 | Medvedev et al. |
| 5,775,792 A | 7/1998 | Wiese |
| 5,813,743 A | 9/1998 | Naka |
| 5,914,760 A | 6/1999 | Daiku |
| 5,931,576 A | 8/1999 | Kreysar et al. |
| 5,947,587 A | 9/1999 | Keuper et al. |
| 5,952,681 A | 9/1999 | Chen |
| 5,965,981 A | 10/1999 | Inoguchi et al. |
| 5,982,092 A | 11/1999 | Chen |
| 6,007,226 A | 12/1999 | Howard |
| 6,075,652 A | 6/2000 | Ono et al. |
| 6,097,549 A | 8/2000 | Jenkins et al. |
| 6,111,270 A | 8/2000 | Xu et al. |
| 6,123,440 A | 9/2000 | Albou |
| 6,129,447 A | 10/2000 | Futami |
| 6,139,147 A | 10/2000 | Zhang |
| 6,152,588 A | 11/2000 | Scifres |
| 6,168,302 B1 | 1/2001 | Hulse |
| 6,191,889 B1 | 2/2001 | Maruyama |
| 6,206,554 B1 | 3/2001 | Schuster et al. |
| 6,245,259 B1 | 6/2001 | Hohn et al. |
| 6,283,623 B1 | 9/2001 | Chinniah et al. |
| 6,288,417 B1 | 9/2001 | Nickel et al. |
| 6,292,293 B1 | 9/2001 | Chipper |
| 6,305,830 B1 | 10/2001 | Zwick et al. |
| 6,327,086 B1 | 12/2001 | Unno |
| 6,334,702 B1 | 1/2002 | Albou |
| 6,352,359 B1 | 3/2002 | Shie et al. |
| 6,356,394 B1 | 3/2002 | Glienicke |
| 6,366,018 B1 | 4/2002 | Garbuzov et al. |
| 6,367,950 B1 | 4/2002 | Yamada et al. |
| 6,367,954 B1 | 4/2002 | Futami |
| 6,367,957 B1 | 4/2002 | Hering et al. |
| 6,402,355 B1 | 6/2002 | Kinouchi |
| 6,404,125 B1 | 6/2002 | Garbuzov et al. |
| 6,431,738 B1 | 8/2002 | Kondo et al. |
| 6,447,155 B2 | 9/2002 | Kondo et al. |
| 6,454,443 B2 | 9/2002 | Natsume et al. |
| 6,462,874 B1 | 10/2002 | Soskind |
| 6,481,864 B2 | 11/2002 | Hosseini et al. |
| 6,527,411 B1 | 3/2003 | Sayers |
| 6,536,918 B1 | 3/2003 | Boroczki et al. |
| 6,543,923 B2 | 4/2003 | Tamai |
| 6,547,423 B2 | 4/2003 | Marshall et al. |
| 6,560,038 B1 | 5/2003 | Parkyn, Jr. et al. |
| 6,586,874 B1 | 7/2003 | Komoto et al. |
| 6,588,919 B1 | 7/2003 | Jones |
| 6,604,843 B2 | 8/2003 | Shpizel |
| 6,616,299 B2 | 9/2003 | Martineau |
| 6,616,305 B1 | 9/2003 | Simon |
| 6,623,132 B2 | 9/2003 | Lekson et al. |
| 6,626,565 B2 | 9/2003 | Ishida |
| 6,679,618 B1 | 1/2004 | Suckow et al. |
| 6,697,130 B2 | 2/2004 | Weindorf et al. |
| 6,698,908 B2 | 3/2004 | Sitzema, Jr. et al. |
| 6,717,362 B1 | 4/2004 | Lee et al. |
| 6,724,543 B1 | 4/2004 | Chinniah et al. |
| 6,726,346 B2 | 4/2004 | Shoji |
| 6,755,556 B2 | 6/2004 | Gasquet et al. |
| 6,757,109 B2 | 6/2004 | Bos |
| 6,783,269 B2 | 8/2004 | Pashley et al. |
| 6,791,259 B1 | 9/2004 | Stokes et al. |
| 6,805,456 B2 | 10/2004 | Okuwaki |
| 6,807,019 B2 | 10/2004 | Takeuchi et al. |
| 6,814,475 B2 | 11/2004 | Amano |
| 6,814,480 B2 | 11/2004 | Amano |
| 6,819,505 B1 | 11/2004 | Cassarly et al. |
| 6,819,506 B1 | 11/2004 | Taylor et al. |
| 6,824,284 B2 | 11/2004 | Chinniah et al. |
| 6,854,853 B2 | 2/2005 | Rovik et al. |
| 6,856,087 B2 | 2/2005 | Lin et al. |
| 6,876,146 B2 | 4/2005 | Yano et al. |
| 6,899,443 B2 | 5/2005 | Rizkin et al. |
| 6,903,506 B2 | 6/2005 | Kita et al. |
| 6,910,783 B2 | 6/2005 | Mezei et al. |
| 2001/0019244 A1 | 9/2001 | Yamazaki et al. |
| 2002/0008969 A1 | 1/2002 | Mabuchi et al. |
| 2002/0053872 A1 | 5/2002 | Yang et al. |
| 2002/0080615 A1 | 6/2002 | Marshall et al. |
| 2002/0093820 A1 | 7/2002 | Pederson |
| 2002/0125492 A1 | 9/2002 | Shakuda |
| 2002/0126400 A1 | 9/2002 | Muller-Rissmann et al. |
| 2002/0136022 A1 | 9/2002 | Nakata |
| 2002/0167820 A1 | 11/2002 | Haering et al. |
| 2002/0172052 A1 | 11/2002 | Perlo et al. |
| 2003/0007359 A1 | 1/2003 | Sugawara et al. |
| 2003/0067784 A1 | 4/2003 | Erber |
| 2003/0075167 A1 | 4/2003 | Minano Dominguez et al. |
| 2003/0099113 A1 | 5/2003 | Gebauer et al. |
| 2003/0123159 A1 | 7/2003 | Morita et al. |
| 2003/0123262 A1 | 7/2003 | Suehiro et al. |
| 2003/0218882 A1 | 11/2003 | Wirth et al. |
| 2003/0235050 A1 | 12/2003 | West et al. |
| 2004/0012976 A1 | 1/2004 | Amano |
| 2004/0061124 A1 | 4/2004 | Trottier et al. |
| 2004/0069992 A1 | 4/2004 | Lin et al. |
| 2004/0070855 A1 | 4/2004 | Benitez et al. |
| 2004/0109326 A1 | 6/2004 | Uhl |
| 2004/0114393 A1 | 6/2004 | Galli |
| 2004/0120157 A1 | 6/2004 | Bottesch et al. |
| 2004/0130904 A1 | 7/2004 | Yamada et al. |
| 2004/0141323 A1 | 7/2004 | Aynie et al. |
| 2004/0144986 A1 | 7/2004 | Chen et al. |
| 2004/0145899 A1 | 7/2004 | Riebling et al. |
| 2004/0150331 A1 | 8/2004 | Okubo et al. |
| 2004/0150991 A1 | 8/2004 | Ouderkirk et al. |
| 2004/0164672 A1 | 8/2004 | Kawaguchi et al. |
| 2004/0179349 A1 | 9/2004 | Buelow, II et al. |
| 2004/0202003 A1 | 10/2004 | Lyst, Jr. |
| 2004/0207319 A1 | 10/2004 | Erchak et al. |
| 2004/0212998 A1 | 10/2004 | Mohacsi |
| 2004/0218392 A1 | 11/2004 | Leadford |
| 2004/0238837 A1 | 12/2004 | Jacob et al. |
| 2004/0257827 A1 | 12/2004 | Ishida et al. |
| 2004/0264199 A1 | 12/2004 | Shu et al. |
| 2005/0007753 A1 | 1/2005 | Van Hees et al. |
| 2005/0018331 A1 | 1/2005 | Pautet et al. |
| 2005/0024744 A1 | 2/2005 | Falicoff et al. |
| 2005/0057938 A1 | 3/2005 | Mertens et al. |
| 2005/0078483 A1 | 4/2005 | Bernard et al. |
| 2005/0083699 A1 | 4/2005 | Rhoades et al. |
| 2005/0243237 A1 | 11/2005 | Sasuga |
| 2006/0124947 A1* | 6/2006 | Mueller et al. ............ 257/98 |

OTHER PUBLICATIONS

Product Brochure—Carclo Precision Optics; LED Optics; 2 Pages.
DE 3317519 A1—English Abstract—Published Nov. 15, 1948.
JP05205511—English Abstract—Published Aug. 13, 1993.
JP06260006—English Abstract—Published Sep. 16, 1994.
JP02001257381—English Abstract—Published Sep. 21, 2001.
WO 89/08223—English Abstract—Published Aug. 9, 1989.

* cited by examiner

US 7,564,070 B2

LIGHT EMITTING DIODE DEVICE HAVING A SHIELD AND/OR FILTER

FIELD OF THE INVENTION

The present invention relates generally to light emitting diode devices, and more particularly relates to the shielding and filtering of light from such devices.

BACKGROUND OF THE INVENTION

Light emitting diodes (LED's) are fast becoming a preferable light source for automotive lighting applications, as they consume less power but provide light output which is acceptable for such applications. Typically, lenses are used in conjunction with reflectors in order to provide a projected image of illumination or beam pattern which corresponds to a particular automotive lighting function. Unfortunately, this beam pattern has relatively low-gradient edges, thus limiting the application of LED's in automotive applications requiring high-gradient regions of the beam pattern. Accordingly, there exists a need to provide a LED device capable of providing a beam pattern having high-gradient edges or regions.

BRIEF SUMMARY OF THE INVENTION

The present invention provides a light emitting diode device capable of shielding or filtering the light in a manner to provide high-gradient edges or regions within the beam pattern. The LED device is also capable of providing selective coloring, thereby cost effectively improving the adaptability and number of applications which can utilize the LED device. The LED device generally comprises a housing, a LED chip, and an optical layer. The LED chip is mounted to the housing and generates light. The optical layer is positioned in front of the LED chip and includes a material having light transmission properties which change in response to electricity being supplied to the optical layer. In this manner, the optical layer can transmit or absorb light from the LED chip, thus shielding or filtering light from the LED chip. For example, the optical layer may shield or filter light to create a high gradient along an edge of the beam pattern produced by the light. Further, the optical layer may filter certain wavelengths of light from the LED chip to determine the color of light delivered by the LED device.

According to more detailed aspects, the material of the optical layer preferably comprises liquid crystal, and the optical layer preferably comprises an LCD. The LED device preferably includes a conversion layer positioned on the LED chip for converting light from the LED chip to white light. The conversion layer typically includes phosphor. Here, the optical layer is positioned on the conversion layer. As such, the optical layer may filter the white light to provide selective coloring. The optical layer may cover all edges of the LED chip, or may cover less than all edges of the LED chip which may be preferable for applications requiring a high-gradient region in only one portion or edge of the beam pattern. The LED device may also include a second optical layer positioned in front of the optical layer, and one optical layer may filter the light from the LED chip while the other optical layer shields light from the LED chip.

BRIEF DESCRIPTION OF THE DRAWINGS

The accompanying drawings incorporated in and forming a part of the specification illustrate several aspects of the present invention, and together with the description serve to explain the principles of the invention. In the drawings.

DETAILED DESCRIPTION OF THE INVENTION

Figure 1:
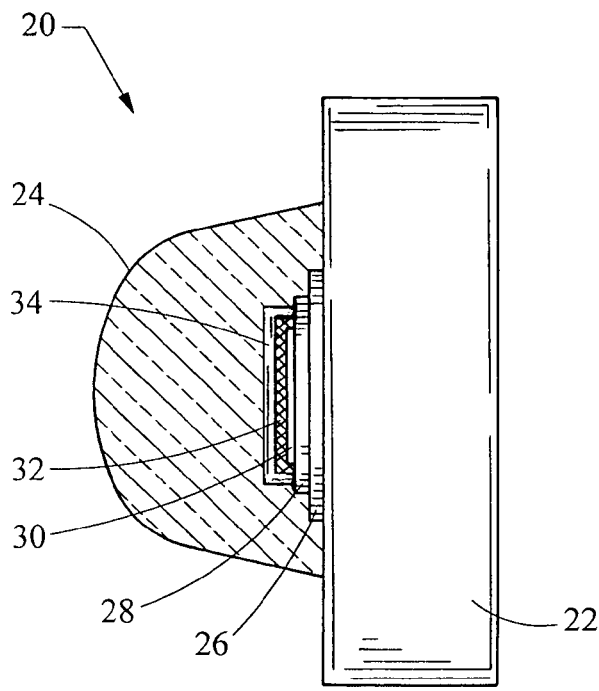
FIG. 1 is a side view of a light emitting diode device constructed in accordance with the teachings of the present invention.
Figure 2:
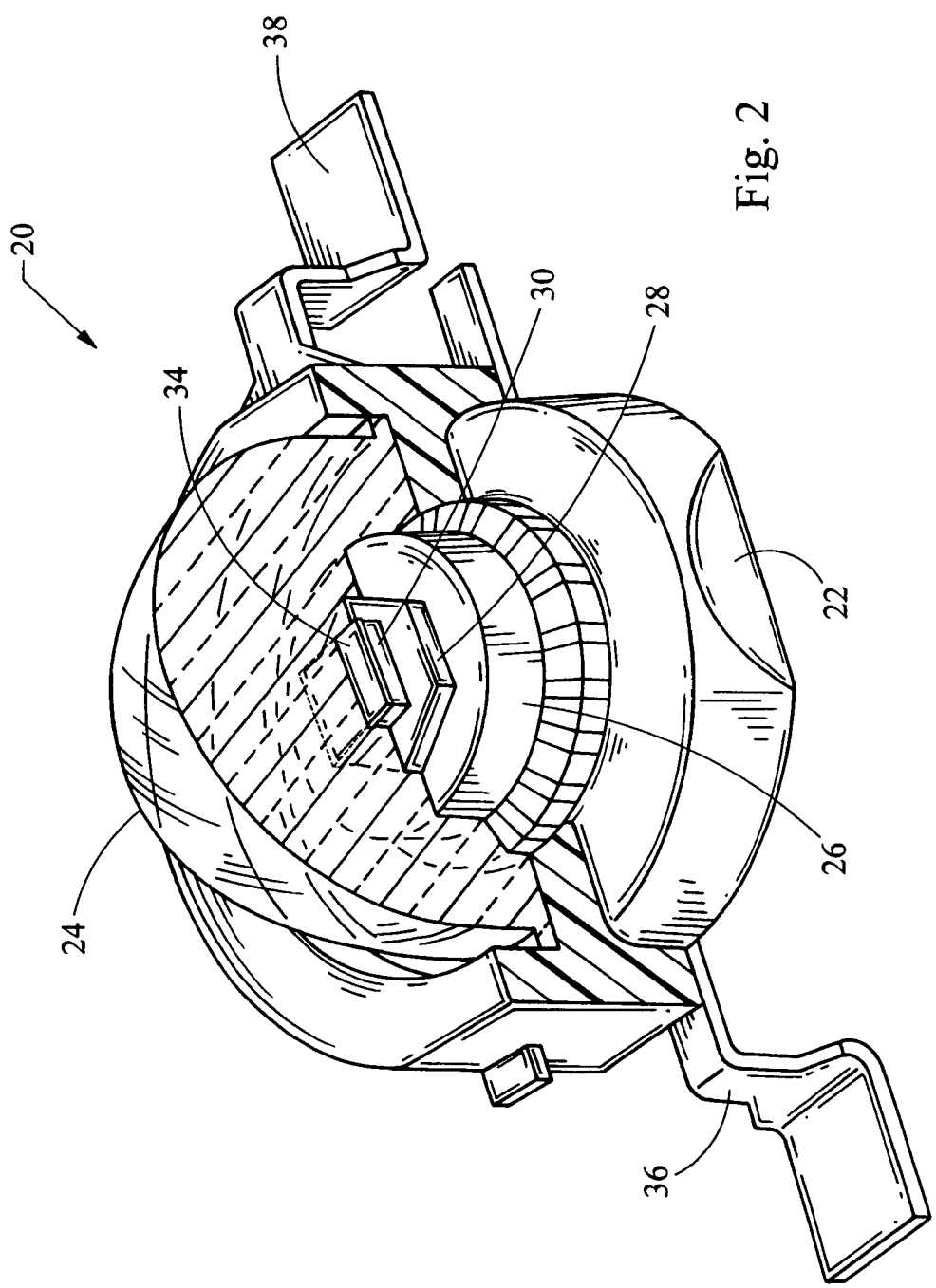
FIG. 2 is a perspective view of the light emitting diode device depicted in FIG. 1.

Turning now to the figures, FIGS. 1 and 2 depict a light emitting diode LED device 20 constructed in accordance with the teachings of the present invention. The LED device 20 generally includes a housing 22 and a casing 24 encapsulating the elements of the device 20. The casing 24 may be constructed as part of and unitarily with the housing 22, or the casing 24 may be a separate element. In either case, the casing 24 is generally constructed of a clear optical grade material for transmission of light, although the casing 24 may be colored or otherwise modified so long as its transmits light forwardly (to the left in FIG. 1). The casing 24 has been shown as a solid optical dome, although it will be recognized that the casing 24 can comprise a thin walled dome leaving air between the casing 24 and the other LED components 26-34.

As is known in the art, a slug 26 is connected to the housing 22. A sub-mount 28 is positioned on the slug and is used for mounting a LED chip 30. The LED chip is a structure well known in the art and all forms of such LED chips, now known or derived in the future, may be used in conjunction with the LED device 20 of the present invention. Briefly, the LED chip generally comprises a diode which is a simple semiconductor device, and the application of voltage across the diode causes interactions of electrons and holes in a depletion zone, resulting in the generation of light. Leads (not shown) are used to apply such voltage to the LED chip 30. Preferably, the chip 30 comprises an InGaN chip (Indium Gallium Nitride) which provides light having a brightness suitable for automotive applications, although it will be recognized that numerous other types of LED chips may be employed including organic LED's and others. It will also be recognized by those skilled in the art that the LED device 20 of the present invention may be applied to many industries in addition to the automotive industry, as numerous other applications require high-gradient regions and/or selective coloring.

The LED chip 30 is covered with a conversion layer 32 which converts light from the LED chip 30 to white light. The conversion layer typically consists of phosphor, such as a powder coating held in place by a transparent coating, although the phosphor may be imbedded in a matrix material and positioned on the LED chip 30. It can be seen in FIG. 1 that the conversion layer 32 covers both the forward facing surface and the side surfaces of the LED chip 30 so as to convert all light emanating therefrom. While the conversion layer 32 is recommended, especially for applications in which white light or selective coloring is desired, it will be recognized by those skilled in the art that the conversion layer 32 may be dispensed with and the light generated directly from the LED chip 30 may be shielded in or filtered, as will be described below.

An optical layer 34 is positioned on the conversion layer 32 for shielding and/or filtering of light from the LED chip 30. The optical layer 34 preferably is sized larger than the LED chip 30 and the conversion layer 32, and thus projects beyond the edges thereof in order to shield and/or filter a substantial portion of the light. As shown, the optical layer 34 wraps around the chip 30 and its conversion layer 32. The optical layer 34 includes a material having light transmission properties which change in response to electricity being supplied to the optical layer. Preferably, the material is liquid crystal and the optical layer is a liquid crystal display (LCD), which is well known in the art. Briefly, two substrates (such as polarized glass or polarizing films) sandwich liquid crystal therebetween, and the application of an electric charge to the liquid crystal molecules causes them to twist (or untwist) thereby controlling light transmission through that area of the LCD. Most preferably, the optical layer 34 is an active matrix LCD which utilizes thin film transistors (TFT's) which allows for excellent control over the transmission and absorption properties of the optical layer 34 through careful control of the voltage supplied to the liquid crystal.

It will also be recognized that the optical layer 34 is preferably a color LCD whereby color filters are employed in order to provide selective transmission of certain colors through the layer 34 (i.e. selective filtering or band pass). It will be recognized by those skilled in the art that LCD technology is a rapidly evolving field, and several variations of liquid crystal technology are and will be developed, including super twisted pneumatics, dual scan twisted pneumatics, ferrule electric liquid crystal and surface stabilized ferrule electric liquid crystal. Likewise, it will be recognized that other materials are known and may be developed which have light absorption properties that are responsive to the application of an electric charge to the material to provide control over light absorption and transmission all of which are contemplated for use in the optical layer 34 of the present invention. A controller (not shown) can be preprogrammed to regulate the electric charge applied to the material and the optical layer 34 in order to control the absorption/transmission properties thereof. For example, various sensors may be employed in a closed loop control system, or operator input or other vehicle inputs may be utilized by the controller in order to regulate the electricity supplied to the optical layer 34.

Accordingly, it will be recognized by those skilled in the art that through the addition of the optical layer 34 immediately on top of the LED chip 30 and conversion layer 32, the absorption and transmission of light through the optical layer 34 may be well controlled to achieve a number of objects. For example, the edges of the produced beam pattern (i.e. beam distribution) may be readily defined to have a high-gradient, which is desired in many applications including automotive applications such as headlamps and tail lights. Likewise, the intensity of light or the brightness of the light produced by the LED device 20 may be controlled through controlling the voltage applied to the material and the optical layer 34. Similarly, the color filtration properties of specific areas of the optic layer 34 may be controlled, and, selective filtering may be employed in order to provide for selective coloring and the transmission of a specified color.

Figure 3:
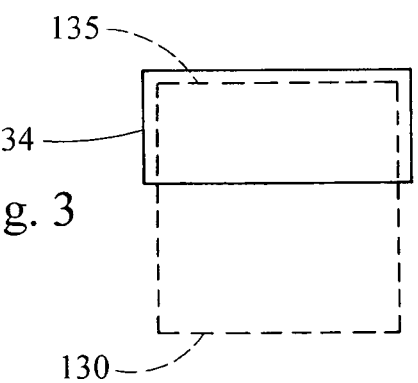
FIG. 3 is a plan view, partially cut-away, of an alternate embodiment of the optical layer forming a portion of the light emitting diode device depicted in FIGS. 1 and 2.

As a particular example, in automotive head lamps the upper edge of the beam pattern is desired to be controlled and to have a high-gradient. Accordingly, the optical layer 34 may be used to shield light along an upper edge of the LED chip 30 and conversion layer 32 for this particular automotive lighting application. For example, as depicted in FIG. 3, the optical layer 34 may be sized and structured to only cover a portion of the LED chip 130. Specifically, only one edge such as a top edge 135 may be completely covered by the optical layer 134. In this manner, shielding and/or filtering may be applied by the optical layer 134 to only a specific region of the beam pattern produced by the LED chip 130. As another example, the optical layer 34 may be utilized to filter light from the chip 30 and conversion layer 32 to provide for full color manipulation for different automotive signaling applications or illumination color rendering. It will be recognized that the shielding layer 34 may be tailored for specific applications.

Figure 4:
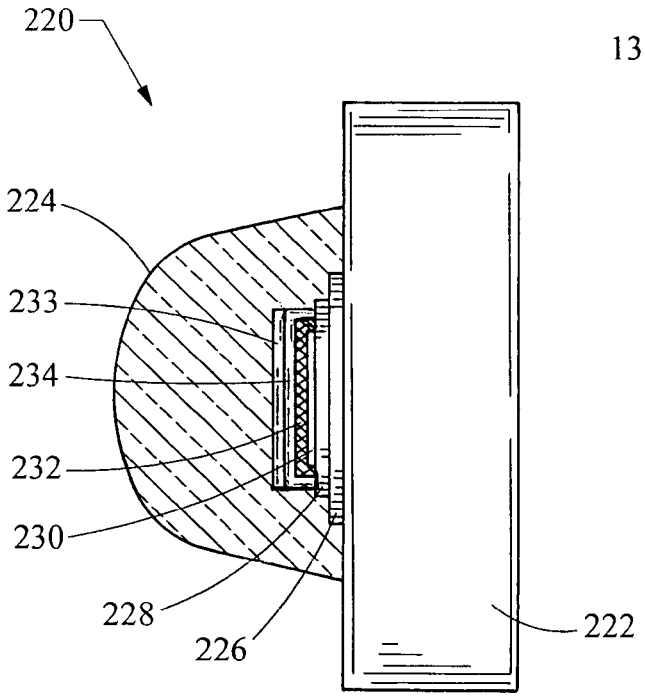
FIG. 4 is a side view of an alternate embodiment of the light emitting diode device depicted in FIGS. 1 and 2.

Turning now to FIG. 4, an alternate embodiment of an LED device 220 has been depicted in a side view. As in the prior embodiment, the LED device 220 includes a housing 222 and a casing 224 for encapsulating a slug 226, sub-mount 228, LED chip 230 and conversion layer 232. In this embodiment, however, a first optical layer 234 is supplemented with a second optical layer 233. In this manner, one of the optical layers 233, 234 may be employed for shielding functions, while the other optical layer 233, 234 may be employed for filtering functions such as color filtering. Each of these optical layers 233, 234 are preferably constructed in a manner as previously described with the prior embodiment. As such, it will be recognized that the LED device 220 provides for separation of the shielding functions and filtering functions through the use of two optical layers.

The foregoing description of various embodiments of the invention has been presented for purposes of illustration and description. It is not intended to be exhaustive or to limit the invention to the precise embodiments disclosed. Numerous modifications or variations are possible in light of the above teachings. The embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

The invention claimed is:

1. A light emitting diode device comprising:
a housing;
a LED chip mounted to the housing, the LED chip generating light;
a casing connected to the housing and encapsulating the LED chip; and
an optical layer positioned in front of the LED chip and behind the casing, the optical layer including a material having light transmission properties which change in response to electricity being supplied to the optical layer.

2. The light emitting diode device of claim 1, wherein the optical layer absorbs light from the LED chip.

3. The light emitting diode device of claim 1, wherein energization of the optical layer shields light from the LED chip.

4. The light emitting diode device of claim 1, wherein energization of the optical layer filters light from the LED chip.

5. The light emitting diode device of claim 4, wherein the optical layer filters certain wavelengths of light from the LED chip.

6. The light emitting diode device of claim 4, wherein the optical layer determines the color of light delivered by the light emitting diode device.

7. The light emitting diode device of claim 1, wherein energization of the optical layer shields or filters light to create a high gradient along an edge of a beam pattern produced by the light.

8. The light emitting diode device of claim 1, wherein the material comprises liquid crystal.

9. The light emitting diode device of claim 8, wherein the optical layer comprises an active matrix LCD.

10. The light emitting diode device of claim 1, wherein the optical layer covers less than all edges of the LED chip.

11. The light emitting diode device of claim 1, further comprising a conversion layer positioned on the LED chip for converting light from the LED chip to white light.

12. The light emitting diode device of claim 11, wherein the conversion layer includes phosphor.

13. The light emitting diode device of claim 11, wherein the optical layer is positioned on the conversion layer.

14. The light emitting diode device of claim 11, wherein the optical layer is directly connected to one of the LED chip and the conversion layer.

15. The light emitting diode device of claim 1, further comprising a second optical layer positioned in front of the optical layer, the second optical layer including a material having light transmission properties which change in response to electricity being supplied to the second optical layer.

16. The light emitting diode device of claim 15, wherein one of the optical layers filters light from the LED chip and the other optical layer shields light from the LED chip.

17. The light emitting diode device of claim 1, wherein the optical layer is positioned immediately on top of the LED chip.

18. A light emitting diode device comprising:
a housing;
a LED chip mounted to the housing, the LED chip generating light; and
an optical layer positioned in front of the LED chip, the optical layer including a material having light transmission properties which change in response to electricity being supplied to the optical layer, wherein the optical layer covers all edges of the LED chip.

* * * * *